US011147187B2

(12) United States Patent
Tokeshi et al.

(10) Patent No.: US 11,147,187 B2
(45) Date of Patent: Oct. 12, 2021

(54) RADIATIVE COOLING DEVICE WITH LIQUID PUMP

(71) Applicant: NIDEC CORPORATION, Kyoto (JP)

(72) Inventors: Toshihiko Tokeshi, Kyoto (JP); Nobuya Nakae, Kyoto (JP); Takahiro Imanishi, Kyoto (JP); Akihiko Makita, Kyoto (JP); Takehito Tamaoka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/672,533

(22) Filed: Nov. 4, 2019

(65) Prior Publication Data

US 2020/0146181 A1 May 7, 2020

(30) Foreign Application Priority Data

Nov. 7, 2018 (JP) .............................. JP2018-209524

(51) Int. Cl.
*H05K 7/20* (2006.01)
*H01L 23/473* (2006.01)

(52) U.S. Cl.
CPC ....... *H05K 7/20272* (2013.01); *H01L 23/473* (2013.01); *H05K 7/20136* (2013.01); *H05K 7/20254* (2013.01); *H05K 7/20263* (2013.01)

(58) Field of Classification Search
CPC .......................... H05K 7/20218–20272; H05K 7/20627–20636; H05K 7/20763–20772; H01L 23/473; G06F 1/20; G06F 2200/201; F28F 23/00; F28F 3/02; F28F 3/12; F28D 1/0246
See application file for complete search history.

(56) References Cited

U.S. PATENT DOCUMENTS

| 8,564,951 B1 * | 10/2013 | Watanabe | H05K 7/20736 361/695 |
| 2012/0087088 A1 * | 4/2012 | Killion | F28F 3/12 361/697 |

(Continued)

FOREIGN PATENT DOCUMENTS

JP  2010156467  7/2010

OTHER PUBLICATIONS

Tokeshi et al., "Cooling Device", U.S. Appl. No. 17/327,819, filed May 24, 2021.

*Primary Examiner* — Zachary Pape
*Assistant Examiner* — Amir A Jalali
(74) *Attorney, Agent, or Firm* — Keating & Bennett, LLP

(57) ABSTRACT

A cooling device includes at least two cooling units, each cooling unit including a plate-shaped cold plate extending in a horizontal direction, a radiator extending in a first direction perpendicular to the horizontal direction and having a plurality of plate-shaped fins which, on the cold plate, is disposed parallel to a second direction perpendicular to the first direction, and a pump which supplies a refrigerant liquid to the cold plate and the radiator, in which the pump is adjacent to the radiator and is disposed in the second direction of the radiator, and the pump of one first cooling unit of the two cooling units faces the other second cooling unit of the two cooling units in the second direction or in a third direction orthogonal to the first direction and the second direction.

8 Claims, 3 Drawing Sheets

(56) References Cited

U.S. PATENT DOCUMENTS

| | | | |
|---|---|---|---|
| 2013/0020057 A1* | 1/2013 | Suzuki | H05K 7/20772 |
| | | | 165/104.31 |
| 2014/0071623 A1* | 3/2014 | Suzuki | H05K 7/20272 |
| | | | 361/699 |
| 2014/0071624 A1* | 3/2014 | Aoki | H05K 7/20263 |
| | | | 361/699 |
| 2014/0251583 A1* | 9/2014 | Eriksen | H05K 7/20 |
| 2015/0060027 A1* | 3/2015 | Tawa | F28F 1/025 |
| | | | 165/143 |
| 2017/0235350 A1* | 8/2017 | Tsai | G06F 1/20 |
| | | | 165/80.4 |
| 2020/0124337 A1* | 4/2020 | Tokeshi | H01L 23/473 |
| 2020/0178417 A1* | 6/2020 | Zhang | G06F 1/20 |

* cited by examiner

RADIATIVE COOLING DEVICE WITH LIQUID PUMP

CROSS-REFERENCE TO RELATED APPLICATION

This application claims the priority of Japan patent application serial no. 2018-209524, filed on Nov. 7, 2018. The entirety of the above-mentioned patent application is hereby incorporated by reference herein and made a part of this specification.

BACKGROUND

Technical Field

The disclosure relates to a cooling device.

Description of Related Art

For example, in Patent Document 1, a conventional liquid cooling system has a heat receiving plate which comes into thermal contact with a heat source and deprives the heat source of heat, radiators, a pump which circulates a refrigerant between the heat receiving plate and the radiators, and cooling fans which blow cooling air to the radiators. A plurality of radiators with independent flow paths is provided, and fewer cooling fans for blowing the cooling air to the radiators are provided than radiators.

However, in the conventional liquid cooling system, some of the cooling air may flow between the plurality of radiators. Therefore, there is a possibility that the cooling air will not be efficiently blown to the radiators.

PATENT DOCUMENTS

[Patent Document 1] Japanese Patent Laid-Open No. 2010-156467

SUMMARY

It is an objective of the disclosure to efficiently blow cooling air to a radiator and improve a cooling efficiency of the radiator.

The cooling device includes at least two cooling units, the cooling unit includes a plate-shaped cold plate extending in a horizontal direction, a radiator extending in a first direction perpendicular to the horizontal direction and having a plurality of plate-shaped fins which, on the cold plate, is disposed parallel to a second direction perpendicular to the first direction, and a pump which supplies a refrigerant liquid to the cold plate and the radiator, in which the pump is adjacent to the radiator and is disposed in the second direction of the radiator, and the pump of one first cooling unit of the two cooling units faces the other second cooling unit of the two cooling units in the second direction or in a third direction orthogonal to the first direction and the second direction.

An objective of the exemplary embodiment of the disclosure is to improve a cooling efficiency of a radiator.

DESCRIPTION OF THE EMBODIMENTS

Hereinafter, exemplary embodiments of the disclosure will be described with reference to the drawings. Also, in the present application, with respect to a cold plate, a direction in which a radiator is disposed is referred to as "upward" and a direction opposite to the direction in which the radiator is disposed is referred to as "downward," thereby defining a vertical direction. In addition, in the present application, the direction in which the radiator is disposed with respect to the cold plate is referred to as a "first direction." A direction orthogonal to the "first direction" and in which fins are disposed in parallel is referred to as a "second direction." In the present application, a direction orthogonal to the "second direction" in a horizontal direction is referred to as a "third direction," whereby a shape and a positional relationship of respective portions will be described. Further, a direction in which cooling air flows from an upstream side to a downstream side is indicated by an arrow in the figures. However, it should be understood that the above definitions only define the vertical direction and the horizontal direction for the sake of convenience of explanation, and do not limit directions when the cooling device according to the disclosure is manufactured and used.

Also, in the present application, a "parallel direction" includes a substantially parallel direction. Further, in the present application, a "orthogonal direction" includes a substantially orthogonal direction.

First Embodiment

Figure 1:
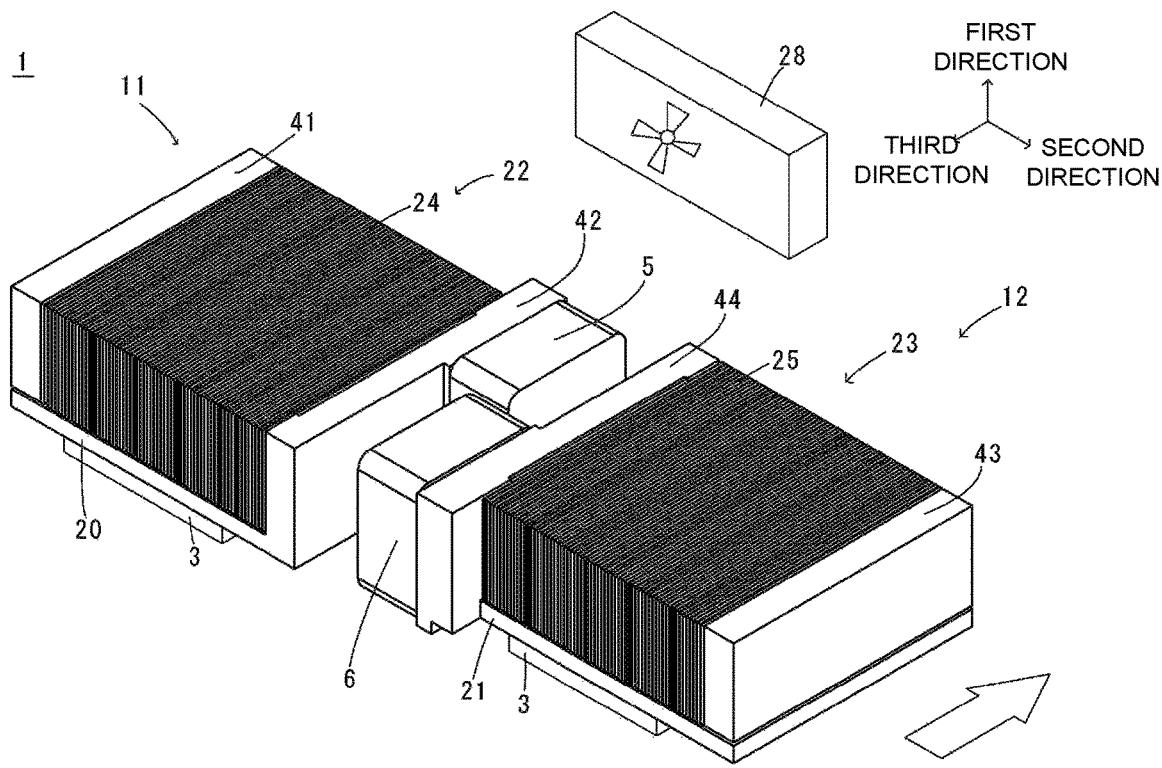
FIG. 1 is a perspective view of a cooling device according to a first exemplary embodiment of the disclosure.

A cooling device 1 according to an exemplary embodiment of the disclosure will be described. FIG. 1 is a perspective view of a cooling device according to a first exemplary embodiment of the disclosure.

The cooling device 1 has at least two cooling units. In the present application, one of the two cooling units will be described as a first cooling unit 11 and the other as a second cooling unit 12. In addition, descriptions of the second cooling unit 12 will be made only with respect to differences from the first cooling unit 11. For the sake of convenience, when the second cooling unit 12 is described, portions having the same configurations as those of the first cooling unit 11 are denoted by the same reference signs as those of the first cooling unit 11.

The cooling units 11 and 12 have cold plates 20 and 21, radiators 22 and 23, and pumps 5 and 6. The radiators 22 and 23 are disposed on the cold plates 20 and 21. Upper surfaces of the cold plates 20 and 21 are in contact with lower surfaces of the radiators 22 and 23. The pumps 5 and 6 are attached to sides of the cooling units 11 and 12 in the second direction.

Cold Plate

The cold plates 20 and 21 are made of a metal having high thermal conductivity such as copper or aluminum and have a rectangular plate shape extending in the horizontal direction in a top view. In addition, although the cold plates 20 and 21 of the present embodiment have a quadrangular shape in a top view, they are not limited thereto, and the cold plates 20 and 21 may have, for example, a polygonal shape having a plurality of corners or a circular shape in a top view. Heat generating components 3 are disposed on lower surfaces of the cold plates 20 and 21.

The cold plates 20 and 21 have first refrigerant channels (not shown) therein through which a refrigerant liquid flows. The first refrigerant channels are spaces in the cold plates 20 and 21. A plurality of blades (not shown) disposed in parallel is provided in the first refrigerant channel. Also, the first refrigerant channel is provided with an inlet (not shown) and an outlet (not shown). The refrigerant liquid that has flowed into the first refrigerant channel through the inlet is discharged from the first refrigerant channel through the outlet.

As the refrigerant liquid in the present embodiment, for example, an antifreeze liquid such as an ethylene glycol aqueous solution or a propylene glycol aqueous solution, pure water, or the like is used.

Radiator

The radiators 22 and 23 are disposed on the cold plates 20 and 21 to extend in the first direction perpendicular to the horizontal direction. The radiators 22 and 23 have a plurality of fins 24 and 25 for cooling and pipes (not shown). The plurality of fins 24 and 25 is formed in a plate shape, stand upright from the upper surface of the cold plates 20 and 21, and are disposed in parallel in the second direction perpendicular to the first direction. The plurality of fins 24 and 25 is disposed on the cold plates 20 and 21 at equal intervals.

Lower ends of the plurality of fins 24 and 25 are in contact with the upper surfaces of the cold plates 20 and 21. Thus, thermal conductivity from the cold plates 20 and 21 to the fins 24 and 25 is improved. Also, the fins 24 and 25 and the cold plates 20 and 21 may be separate members or members formed integrally therewith. In the present embodiment, the fins 24 and 25 are separate members from the cold plate 20 and 21. Lower ends of the fins 24 and 25 are joined to the upper surfaces of the cold plates 20 and 21 by welding, for example.

In the case in which the fins 24 and 25 are members formed integrally with the cold plates 20 and 21, the fins 24 and 25 are formed, for example, by cutting the cold plates 20 and 21. Also, in the case in which the fins 24 and 25 and the cold plates 20 and 21 are separate members, the fins 24 and 25 are preferably made of a metal having high thermal conductivity such as copper or aluminum, like the cold plates 20 and 21 described above. Since the fins 24 and 25 are formed of a metal having high thermal conductivity like the cold plates 20 and 21, heat from the cold plates 20 and 21 can be efficiently transmitted to the fins 24 and 25.

The pipes (not shown) form second refrigerant channels (not shown) which are hollow inside and through which the refrigerant liquid passes. One end portion of the second refrigerant channel is connected to the first refrigerant channel. As will be described later, the second refrigerant channel is connected to the first refrigerant channel via a tank or a pump, for example.

The pipes extend linearly in the third direction. The pipes are inserted into through holes provided in the plurality of fins 24 and 25 and fixed to the plurality of fins 24 and 25 by welding. In this case, a direction in which the pipes extend and a direction in which the fins 24 extend are orthogonal to each other. That is, in the present embodiment, the plurality of fins 24 and 25 extends in the second direction, and the pipes extend in the third direction.

Pump

The first cooling unit 11 has a pump 5. The pump 5 of the first cooling unit 11 is disposed on one side in the second direction. The pump 5 supplies the refrigerant liquid to the cold plate 20 and the radiator 22.

The pump 5 is disposed adjacent to one side of the radiator 22 in the second direction. The pump 5 may be disposed on a side surface of a second tank 42, which will be described later. In the present embodiment, the pump 5 is a centrifugal pump and has a pump channel (not shown) that is a channel for the refrigerant liquid inside a rectangular parallelepiped housing. An impeller (not shown) is disposed in the pump channel. The pump 5 has a suction port (not shown) and a discharge port (not shown).

The suction port of the pump 5, the radiator 22, and the second channel are connected directly or indirectly to each other. The discharge port of the pump 5 is connected to the inlet of the cold plate 20. In the present embodiment, the suction port of the pump 5 and the radiator 22 are connected to each other via the second tank 42.

The impeller of the pump 5 is supported to be rotatable about a central axis extending in the second direction and is connected to a rotational shaft of a motor (not shown). The impeller rotates by driving the motor, and the refrigerant liquid that has flowed in from the suction port is discharged from the discharge port. The pump 5 sucks the refrigerant liquid via the suction port in the direction in which the pipes extend.

The second cooling unit 12 has a pump 6. The pump 6 of the second cooling unit 12 is disposed on the other side in the second direction. The pump 6 supplies the refrigerant liquid to the cold plate 21 and the radiator 23.

The pump 6 is disposed adjacent to the other side in the second direction of the radiator 23. The pump 6 may be disposed on a side surface of a second tank 44, which will be described later. In the present embodiment, the pump 6 is a centrifugal pump and has a pump channel (not shown) that is a channel for the refrigerant liquid inside a rectangular parallelepiped housing. An impeller (not shown) is disposed in the pump channel. The pump 6 has a suction port (not shown) and a discharge port (not shown).

The suction port of the pump 6, the radiator 23, and the second channel are connected directly or indirectly to each other. The discharge port of the pump 6 is connected to the inlet of the cold plate 21. In the present embodiment, the suction port of the pump 6 and the radiator 23 are connected to each other via the second tank 44.

The impeller of the pump 6 is supported to be rotatable about a central axis extending in the second direction and is connected to a rotational shaft of a motor (not shown). The impeller rotates by driving the motor, and the refrigerant liquid that has flowed in from the suction port is discharged from the discharge port. The pump 6 sucks the refrigerant liquid via the suction port in the direction in which the pipes extend.

Tank

The first cooling unit 11 further includes a first tank 41 and a second tank 42 that store the refrigerant liquid. The first tank 41 is disposed on the other side of the first cooling unit 11 in the second direction. The second tank 42 is disposed on one side of the first cooling unit 11 in the second direction. The second tank 42 is disposed between the radiator 22 and the pump 5 in the second direction. One ends of the pipes are connected to the second tank 42, and the other ends of the pipes are connected to the first tank 41. The first tank 41 and the second tank 42 are disposed to face each other in the direction in which the pipes extend. The refrigerant liquid linearly circulates smoothly from the first tank 41 to the second tank 42 through the pipes.

The first tank 41 and the second tank 42 are disposed parallel to a direction in which the fins 24 are arranged, and more fins 24 can be disposed between the first tank 41 and the second tank 42 at predetermined intervals. Thus, a surface area of the entire fins 24 can be enlarged, and a cooling performance of the radiator 22 can be improved. Further, the pipes and the first tank 41 and the second tank 42 can be easily connected to each other.

The pipes pass through the side surfaces of the first tank 41 and the second tank 42 and are directly connected to the first tank 41 and the second tank 42. Thus, the number of components of the cooling device 1 can be reduced.

The first tank 41 and the second tank 42 are a rectangular parallelepiped. The second tank 42 is provided with a hole portion (not shown) connected to the pump 5, which will be described later.

By providing the first tank 41 and the second tank 42, an amount of the refrigerant liquid circulated in the first cooling unit 11 can be increased. Therefore, the cooling efficiency of the first cooling unit 11 is improved.

The second cooling unit 12 further includes a first tank 43 and a second tank 44 that store the refrigerant liquid. The first tank 43 is disposed on one side of the second cooling unit 12 in the second direction. The second tank 44 is disposed on the other side of the second cooling unit 12 in the second direction. The second tank 44 is disposed between the radiator 23 and the pump 6 in the second direction. One ends of the pipes are connected to the first tank 43, and the other ends of the pipes are connected to the second tank 44. The first tank 43 and the second tank 44 are disposed to face each other in the direction in which the pipes extend. The refrigerant liquid linearly circulates smoothly from the first tank 43 to the second tank 44 through the pipes.

The first tank 43 and the second tank 44 are disposed parallel to the direction in which the fins 25 are arranged, and more fins 25 can be disposed between the first tank 43 and the second tank 44 at predetermined intervals. Thus, a surface area of the entire fins 25 can be enlarged, and a cooling performance of the radiator 23 can be improved. Further, the pipes and the first tank 43 and the second tank 44 can be easily connected to each other.

The pipes pass through the side surfaces of the first tank 43 and the second tank 44 and are directly connected to the first tank 43 and the second tank 44. Thus, the number of components of the cooling device 1 can be reduced.

The first tank 43 and the second tank 44 are a rectangular parallelepiped. The second tank 44 is provided with a hole portion (not shown) connected to the pump 6, which will be described later.

By providing the first tank 43 and the second tank 44, an amount of the refrigerant liquid circulated in the second cooling unit 12 can be increased. Therefore, the cooling efficiency of the second cooling unit 12 is improved.

Operations of Cooling Unit

In the first cooling unit 11, the heat generating component 3 to be cooled such as a central processing unit (CPU) is brought into contact with the lower surface of the cold plate 20, and the pump 5 is driven.

In this way, the refrigerant liquid circulates in the order of the first refrigerant channel, the first tank 41, the second refrigerant channel, and the second tank 42. Heat generated by the heat generating component 3 is transmitted to the cold plate 20. The heat transmitted to the cold plate 20 is transmitted to the fins 24 through the refrigerant liquid flowing through the first refrigerant channel and the second refrigerant channel, whereby the heat is dissipated through the fins 24 so that a temperature rise of the heat generating component 3 can be curbed. The same applies to the second cooling unit 12.

Blower Fan

A blower fan 28 is disposed at a position facing the first cooling unit 11 or the second cooling unit 12 in the third direction. The blower fan 28 of the present embodiment is an axial flow type. By blowing cooling air in a direction in which the fins 24 and 25 extend in a longitudinal direction (the third direction), heat dissipation from the fins 24 and 25 is promoted, and thus the cooling performance of the radiators 22 and 23 is improved. A plurality of blower fans 28 may be disposed to face the first cooling unit 11 or the second cooling unit 12. Also, in the present embodiment, one fan 28 may be disposed to face both the first cooling unit 11 and the second cooling unit 12.

The pump 5 of the first cooling unit 11 is disposed to face the second cooling unit 12 in the second direction.

The first cooling unit 11 and the second cooling unit 12 are disposed adjacent to each other, and the pump 5 of the first cooling unit 11 and the second cooling unit 12 are disposed to face each other in the second direction, whereby a gap between the pump 5 and the second cooling unit 12 in the second direction can be reduced. Therefore, it becomes difficult for the cooling air to flow into the gap, and the cooling air can efficiently flow into the radiators 22 and 23.

The pump 5 of the first cooling unit 11 is disposed to face the second cooling unit 12 in the third direction orthogonal to the first direction and the second direction.

By disposing the pump 5 of the first cooling unit 11 to face the second cooling unit 12 in the third direction orthogonal to the first direction and the second direction, a gap between the pump 5 and the cooling unit 12 in the third direction can be reduced. Therefore, it becomes difficult for the cooling air to flow into the gap, and the cooling air can efficiently flow into the radiators 22 and 23.

The pump 5 of the first cooling unit 11 and the pump 6 of the second cooling unit 12 are disposed to face each other in the second direction. Specifically, the pump 5 of the first cooling unit 11 is disposed on one side in the second direction. On the other hand, the pump 6 of the second cooling unit 12 is disposed on the other side in the second direction. That is, the pump 5 and the pump 6 are respectively disposed between the first cooling unit 11 and the second cooling unit in the second direction. In the present embodiment, the pump 5 of the first cooling unit 11 is disposed on a downstream side of the cooling air in the third direction from the pump 6 of the second cooling unit 12.

By disposing the pump 5 and the pump 6 to face each other, the gap between the first cooling unit 11 and the second cooling unit 12 can be reduced. By reducing the gap between the first cooling unit 11 and the second cooling unit 12, the cooling air flowing in from the third direction is less likely to pass through the gap between the first cooling unit 11 and the second cooling unit 12. Therefore, by disposing the pump 5 and the pump 6 to face each other, the cooling air can efficiently flow into the radiator 22 of the first cooling unit 11 and the radiator 23 of the second cooling unit 12.

At least a portion of the pump 5 of the first cooling unit 11 and at least a portion of the pump 6 of the second cooling unit 12 are disposed to face each other in the third direction. Since the pump 5 and the pump 6 face each other in the third direction, the gap between the pump 5 and the pump 6 in the third direction can be reduced. Therefore, it becomes difficult for the cooling air to enter the gap. Therefore, the cooling air can efficiently flow into the radiators 22 and 23.

In the present embodiment, the pump 5 of the first cooling unit 11 is disposed to face the second tank 44 of the second cooling unit in the second direction. The pump 6 of the second cooling unit 12 is disposed to face the second tank 42 of the first cooling unit in the second direction. By disposing the pump 5 of the first cooling unit 11 to face the second tank 44 of the second cooling unit 12 in the second direction, the gap between the pump 5 and the second tank 44 can be reduced. Further, by disposing the pump 6 of the second cooling unit 12 to face the second tank 42 of the first cooling unit 11 in the second direction, the gap between the pump 6 and the second tank 42 can be reduced. Therefore, the cooling air is less likely to enter the gap between the pump 5 and the second tank 44. In addition, the cooling air is less likely to enter the gap between the pump 6 and the second tank 42. Therefore, the cooling air can efficiently flow into the radiators 22 and 23.

At least a portion of the pump 5 of the first cooling unit 11 and at least a portion of the pump 6 of the second cooling unit 12 are disposed to face each other in the third direction. By disposing at least a portion of the pump 5 of the first cooling unit 11 and at least a portion of the pump 6 of the second cooling unit 12 to face each other in the third direction, some of the cooling air flowing in between the pump 6 and the second tank 42 collides with the pump 5. Specifically, the cooling air that flows linearly from an upstream side to a downstream side in the third direction collides with an end surface of the pump 5 in the third direction and changes its direction to one side in the second direction. Further, the cooling air whose direction has changed to the one side in the second direction passes between the pump 5 and the pump 6. That is, since the cooling air flowing in the third direction is blocked by the pump 5 and passes between the pump 5 and the pump 6, it does not flow smoothly downstream in the third direction. Accordingly, the cooling air can easily flow into the radiators 22 and 23. Therefore, the cooling air can efficiently flow into the radiators 22 and 23.

Also, the gap between the first cooling unit 11 and the second cooling unit 12 in the second direction is preferably narrow. For example, the gap between the first cooling unit 11 and the second cooling unit 12 adjacent in the second direction is smaller than a width of each cooling unit 11 and 12 in the second direction. By narrowing the gap between the first cooling unit 11 and the second cooling unit 12 in the second direction, the cooling air can be prevented from flowing into the gap, and thus the cooling air can further flow between the fins 24 and 25 of the radiators 22 and 23.

Further, the pumps 5 and 6 of the present embodiment are disposed on side surfaces of the cooling units 11 and 12 in the second direction to be positioned on one side in the third direction. As shown in FIG. 1, the pumps 5 and 6 are disposed on the side surfaces of the cooling units 11 and 12 in the second direction to be positioned on the one side in the third direction, so that the pump 5 and the pump 6 can be disposed to face each other in the third direction. Even in the case in which the distance between the heat generating components 3 adjacent to each other is short, the cooling units 11 and 12 can be enlarged by disposing the pump 5 and the pump 6 to face each other in the third direction. That is, the radiators 22 and 23 can be increased in size, and thus the heat dissipation of the heat generating component 3 can be improved.

Also, the gap between the first cooling unit 11 and the second cooling unit 12 in the second direction may be omitted. That is, the first cooling unit 11 and the second cooling unit 12 may be disposed to be in contact with each other in the second direction. By disposing the first cooling unit 11 and the second cooling unit 12 to be in contact with each other in the second direction, the cooling air can be prevented from flowing between the cooling units, and thus the cooling air can flow into the fins 24 and 25 of the radiators 22 and 23.

In the present embodiment, a structure which is not provided with the first tanks 41 and 43 and the second tanks 42 and 44 may be employed. In the case in which the first tanks 41 and 43 and the second tanks 42 and 44 are not provided, the radiator 22 of the first cooling unit 11 and the pump 6 of the second cooling unit 12 face each other in the second direction, and the radiator 23 of the second cooling unit 12 and the pump 5 of the first cooling unit 110 face each other in the second direction. In the case in which the first tanks 41 and 43 and the second tanks 42 and 44 are not provided, the first cooling unit 11 and the second cooling unit 12 can be made small.

Second Embodiment

Figure 2:
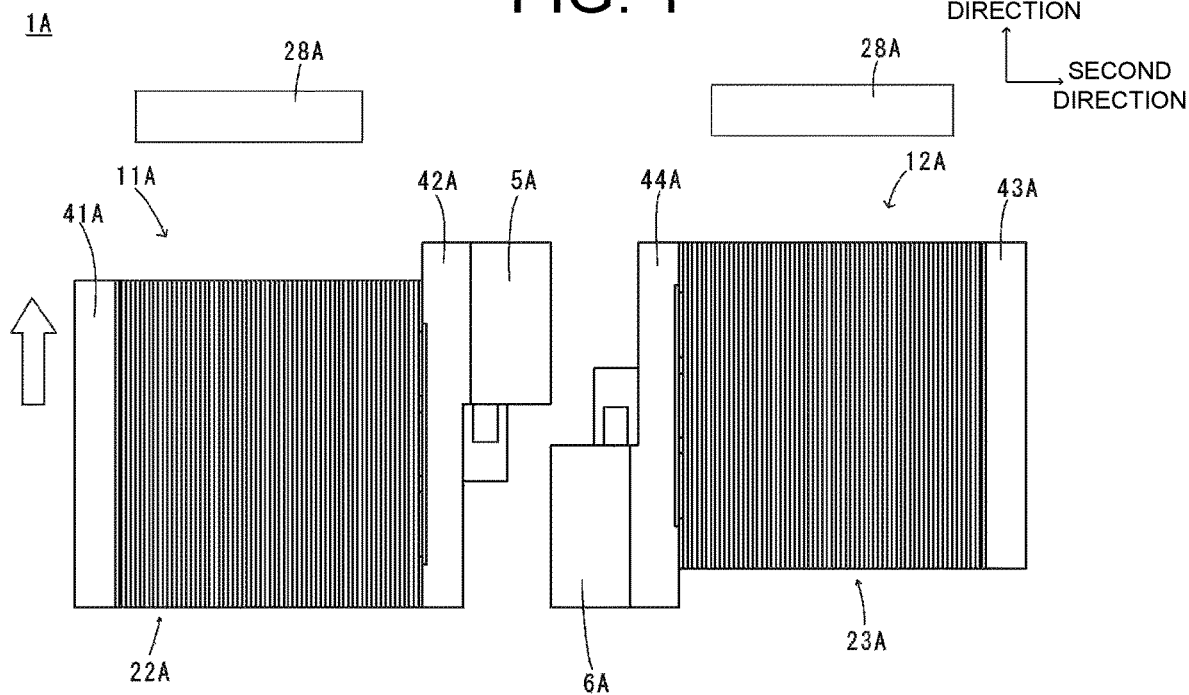
FIG. 2 is a plan view of a cooling device according to a second exemplary embodiment of the disclosure.

A cooling device 1A according to a second exemplary embodiment of the disclosure will be described. FIG. 2 is a plan view of the cooling device 1A according to the second exemplary embodiment. For the sake of convenience of explanation, portions the same as those in the first embodiment are denoted by the same reference signs.

In the present embodiment, a pump 5A of a first cooling unit 11A and a second cooling unit 12A are disposed adjacent to each other. The pump 5A of the first cooling unit 11A is disposed on a downstream side of the cooling air in the third direction from a pump 6A of the second cooling unit 12A. A second tank 42A of the first cooling unit 11A and the pump 6A of the second cooling unit 12A face each other in the second direction, and a second tank 44A of the second cooling unit 12A and the pump 5A of the first cooling unit 11A face each other in the second direction.

In the present embodiment, one end portion of the pump 5A of the first cooling unit 11A in the second direction is in a position the same as that of the other end portion of the pump 6A of the second cooling unit 12A in the second direction. Specifically, when the cooling device 1A is viewed in the third direction, the position of the one end portion of the pump 5A in the second direction and the position of the other end portion of the pump 6A in the second direction are the same in the second direction. In particular, a structure in which there is no gap between the pump 5A and the pump 6A in the second direction when viewed from the third direction may be employed. Any configuration may be employed as long as some of the cooling air flowing from between the pump 6A and the second tank 42A collides with the pump 5A and changes its direction to one side in the second direction. When viewed from the third direction, the position of the one end portion of the pump 5A in the second direction and the position of the other end portion of the pump 6A in the second direction are the same in the second direction, whereby the cooling air flowing from the third direction does not smoothly flow downstream in the third direction. Accordingly, the cooling air flows into the radiators 22A and 23A, not into the gap between the pump 6A and the second tank 42A in the third direction. Therefore, the cooling air can efficiently flow into the radiators 22A and 23A.

In the present embodiment, a structure which is not provided with the first tanks 41A and 43A and the second tanks 42A and 44A may be employed. In the case in which the first tank 41A and 43A and the second tank 42A and 44A are not provided, the radiator 22A of the first cooling unit 11A and the pump 6A of the second cooling unit 12A face each other in the second direction, and the radiator 23A of the second cooling unit 12A and the pump 5A of the first cooling unit 11A face each other in the second direction. In the case in which the first tanks 41A and 43A and the second tank 42A and 44A are not provided, the first cooling unit 11A and the second cooling unit 12A can be made small.

Third Embodiment

Figure 3:
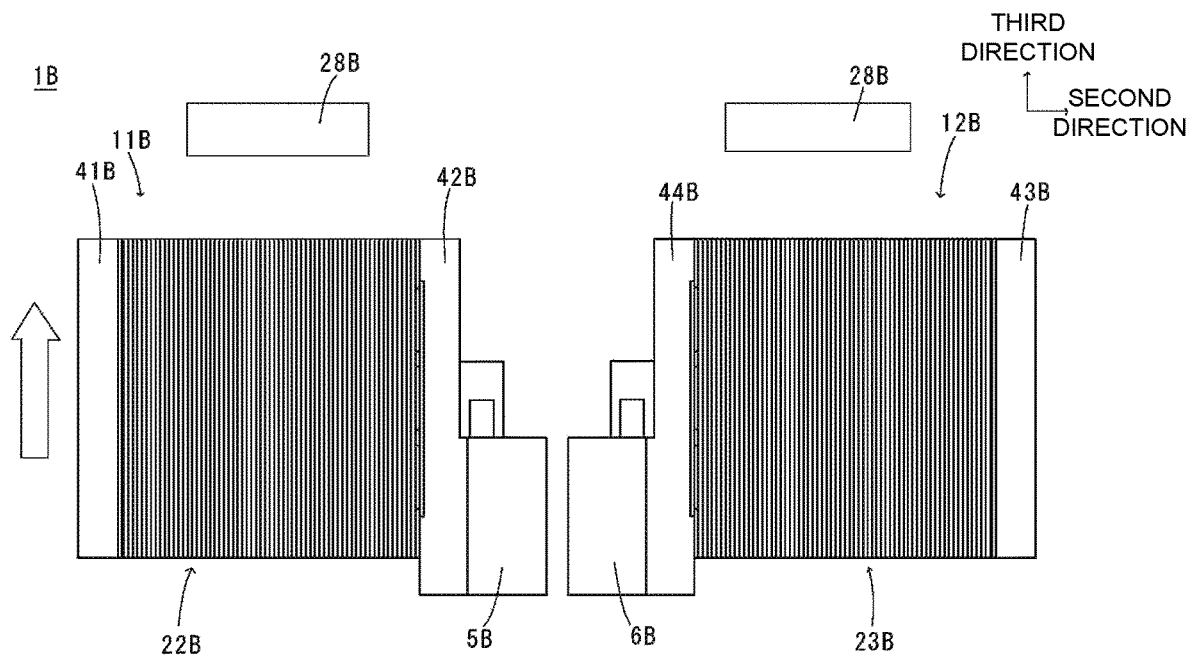
FIG. 3 is a plan view of a cooling device according to a third exemplary embodiment of the disclosure.

A cooling device 1B according to a third exemplary embodiment of the disclosure will be described. FIG. 3 is a plan view of the cooling device 1B according to the third exemplary embodiment. For convenience of explanation, portions the same as those in the first embodiment are denoted by the same reference signs.

In the present embodiment, the pump 5B of the first cooling unit 11B and the second cooling unit 12B are disposed adjacent to each other. The pump 5B of the first cooling unit 11B and the pump 6B of the second cooling unit 12B are disposed to face each other in the second direction.

Specifically, one surface of the pump 5B in the second direction and the other surface of the pump 6B in the second direction are disposed to face each other in the second direction. By disposing the pump 5B and the pump 6B to face each other in the second direction and reducing the gap between the pump 5B and the pump 6B in the second direction, the cooling air flowing in from the third direction is less likely to pass through the gap between the pump 5B and the pump 6B in the second direction. Therefore, by disposing the pump 5B and the pump 6B to face each other in the second direction, the cooling air can efficiently flow into the radiator 22B of the first cooling unit 11B and the radiator 23B of the second cooling unit 12B.

The pump 5B and the pump 6B are desirably disposed on the upstream side of the cooling air in the third direction. When the cooling air flows into the gap between the pump 5B and the pump 6B, by reducing the width of the gap in the second direction on the upstream side of the cooling air, the cooling air can be more difficult to flow into the gap, and thus the cooling air can efficiently flow into the radiators 22B and 23B.

In the present embodiment, a structure which is not provided with the first tanks 41B and 43B and the second tanks 42B and 44B may be employed. In the case in which the first tanks 41B and 43B and the second tanks 42B and 44B are not provided, the radiator 22B of the first cooling unit 11B and the radiator 23B of the second cooling unit 12B face each other in the second direction. In the case in which the first tanks 41B and 43B and the second tanks 42B and 44B are not provided, the first cooling unit 11B and the second cooling unit 12B can be made small.

Fourth Embodiment

Figure 4:
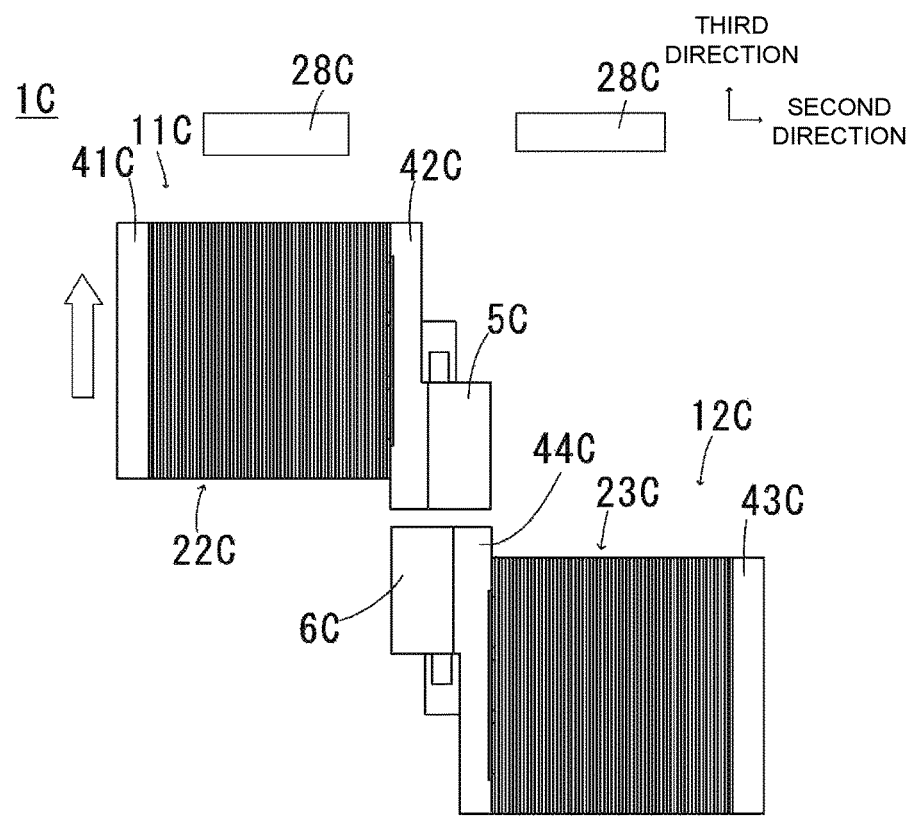
FIG. 4 is a plan view of a cooling device according to a fourth exemplary embodiment of the disclosure.

A cooling device 1C according to a fourth exemplary embodiment of the disclosure will be described. FIG. 4 is a plan view of the cooling device 1C according to the fourth exemplary embodiment. For convenience of explanation, portions the same as those in the first embodiment are denoted by the same reference signs.

In the present embodiment, a pump 5C of a first cooling unit 11C and a pump 6C of a second cooling unit 12C are disposed adjacent to each other in the third direction. The first cooling unit 11C is disposed on a downstream side of the cooling air in the third direction from the second cooling unit 12C. Specifically, the pump 5C of the first cooling unit 11C is disposed on a downstream side of the cooling air in the third direction from the pump 6C of the second cooling unit 12C.

In the present embodiment, a second tank 42C of the first cooling unit 11C and a second tank 44C of the second cooling unit 12C does not face to each other in the second direction, and the pump 5C and the pump 6C face to each other in the third direction.

By disposing the pump 5C and the pump 6C to face each other in the third direction, the gap between the pump 5C and the pump 6C can be reduced. Therefore, it becomes difficult for the cooling air to flow into the gap, and thus the cooling air can efficiently flow into the radiator 22C.

In the present embodiment, when viewed from the third direction, the pump 6C of the second cooling unit 12C overlaps the first tank 42C in the second direction. When viewed from the third direction, it is desirable that the pump 6C of the second cooling unit 12C does not overlap the radiator 22C in the second direction. When viewed from the third direction, the pump 6C overlaps the radiator 22C in the second direction, so that the pump 6C blocks some of the cooling air flowing into the radiator 22C. Therefore, when viewed from the third direction, the pump 6C does not overlap the radiator 22C in the second direction, but overlaps the first tank 42C in the second direction, so that the cooling air can smoothly flow into the radiator 22C.

Also, in the present embodiment, a structure which is not provided with the first tanks 41C and 43C and the second tanks 42C and 44C may be employed. In the case in which the first tanks 41C and 43C and the second tanks 42C and 44C are not provided, the first cooling unit 11C and the second cooling unit 12C can be made small. Further, even in the case in which the first tanks 41C and 43C and the second tanks 42C and 44C are not provided, it is desirable that the pump 6C and the radiator 22C do not overlap in the second direction when viewed from the third direction.

Fifth Embodiment

Figure 5:
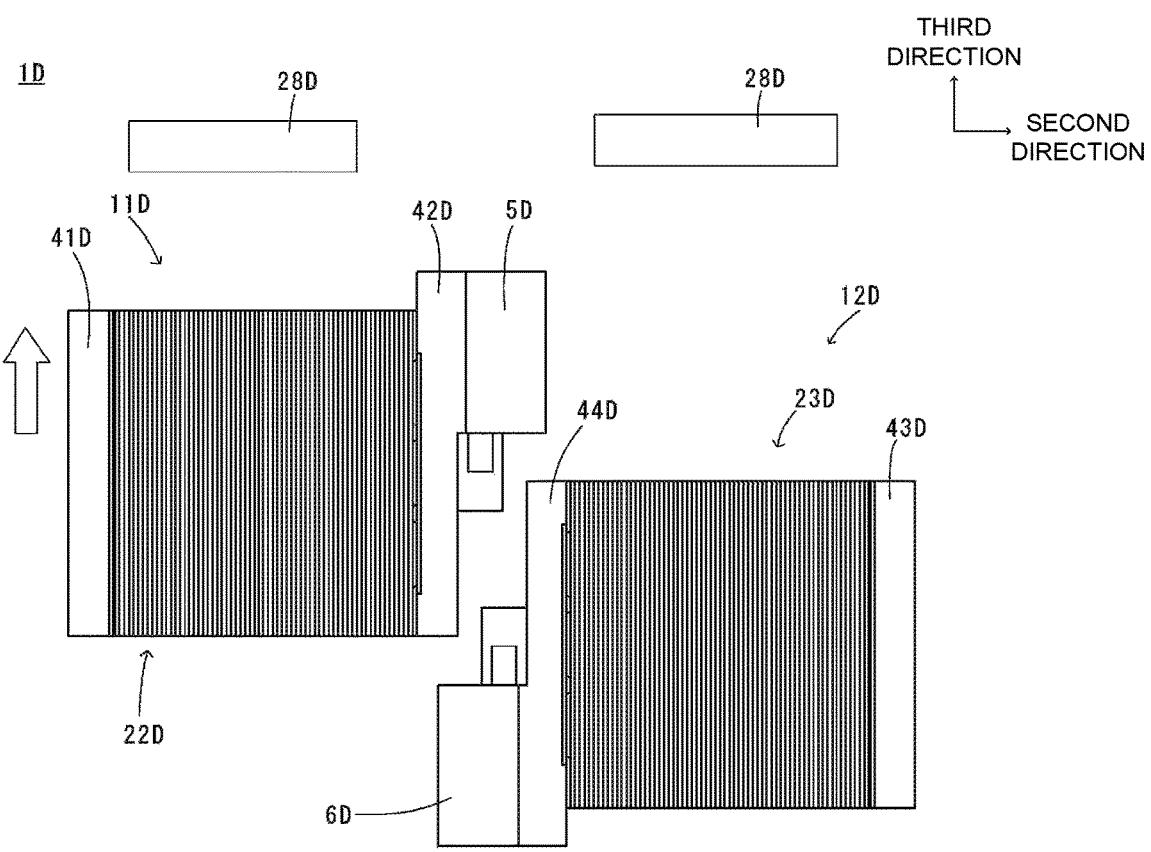
FIG. 5 is a plan view of a cooling device according to a fifth exemplary embodiment of the disclosure.

A cooling device 1D according to a fifth exemplary embodiment of the disclosure will be described. FIG. 5 is a plan view of the cooling device 1D according to the fifth exemplary embodiment. For convenience of explanation, portions the same as those in the first embodiment are denoted by the same reference signs.

In the present embodiment, a first cooling unit 11D and a second cooling unit 12D are disposed adjacent to each other. The first cooling unit 11D is disposed on a downstream side of the cooling air in the third direction from the second cooling unit 12D. A pump 5D of the first cooling unit 11D is disposed on a downstream side of the cooling air in the third direction from a pump 6D of the second cooling unit 12D.

A portion of a second tank 42D and a portion of a second tank 44D are disposed to face each other in the second direction. Also, the second tank 42D and the pump 6D are disposed adjacent to each other. By disposing the second tank 42D and the pump 6D to be adjacent to each other, a gap between the second tank 42D and the pump 6D can be reduced. Specifically, the second tank 42D and the pump 6D are disposed to face each other in the third direction. By reducing the gap between the second tank 42D and the pump 6D, the cooling air flowing in from the third direction is less likely to pass through the gap between the second tank 42D and the pump 6D. Therefore, by disposing the second tank 42D and the pump 6D to face each other in the third direction, the cooling air can efficiently flow into the radiator 22D.

It is desirable that the pump 6D does not overlap with the radiator 22D in the third direction when viewed from the upstream side of the cooling air in the third direction. Since the pump 6D and the radiator 22D do not overlap in the third direction.

It is possible to inhibit the cooling air flowing into the radiator 22D from the third direction from being blocked by the pump 6D. Therefore, the cooling air can efficiently flow into the radiator 22D.

Also, in the present embodiment, a structure which is not provided with the first tanks 41D and 43D and the second tanks 42D and 44D may be employed. In the case in which the first tanks 41D and 43D and the second tanks 42D and 44D are not provided, the first cooling unit 11D and the second cooling unit 12D can be made small. Even in the case in which the first tanks 41D and 43D and the second tanks 42D and 44D are not provided, it is desirable that the pump 6D and the radiator 22D do not overlap in the second direction when viewed from the third direction.

Sixth Embodiment

Figure 6:
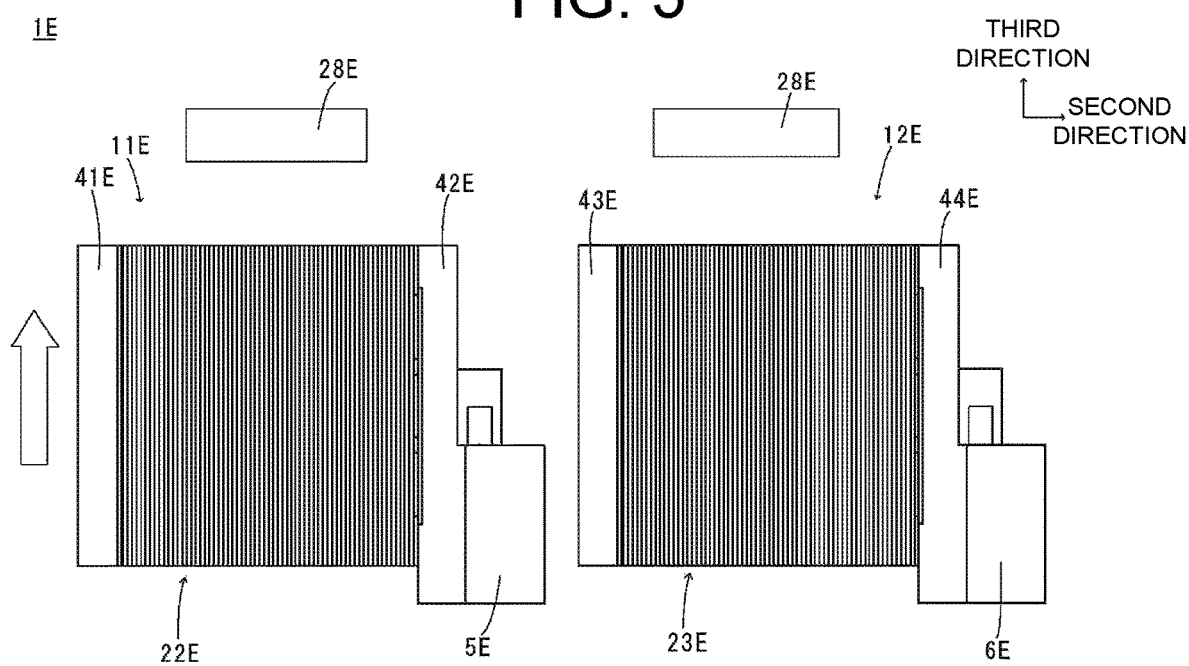
FIG. 6 is a plan view of a cooling device according to a sixth exemplary embodiment of the disclosure.

A cooling device 1E according to a sixth exemplary embodiment of the disclosure will be described. FIG. 6 is a plan view of the cooling device 1E according to the sixth exemplary embodiment. For convenience of explanation, portions the same as those in the first embodiment are denoted by the same reference signs.

A pump 5E of a first cooling unit 11E is disposed on one side in the second direction. Also, a pump 6E of a second cooling unit 12E is disposed on one side in the second direction. In the present embodiment, the pump 5E of the first cooling unit 11E and a first tank 43E of the second cooling unit are disposed adjacent to each other in the second direction. Specifically, the pump 5E and the first tank 43E are disposed to face each other in the second direction. By disposing the pump 5E and the first tank 43E to face each other in the second direction and reducing a gap between the pump 5E and the first tank 43E in the second direction, the cooling air flowing in from the third direction is less likely to pass through the gap between the pump 5E and the first tank 43E. Therefore, by disposing the pump 5E and the first tank 43E to face each other, the cooling air can efficiently flow into the radiator 22E of the first cooling unit 11E and the radiator 23E of the second cooling unit 12E.

Since the pump 5E and the pump 6E do not face each other in the second direction, when the first cooling unit 11E and the second cooling unit 12E are attached, interference between the pump 5E and the pump 6E can be prevented, and thus damage to the cooling device 1E can be curbed.

Also, in the present embodiment, although a structure in which the pump 5E and the tank 43E are disposed to face each other in the second direction has been described, the second cooling unit 12E may not have the first tank 43E. In the case in which the second cooling unit 12E is not provide with the first tank 43E, the pump 5E and the radiator 23E face each other in the second direction.

Other

In the above embodiments, a centrifugal pump is used, but a diaphragm pump, a cascade pump, or the like may be used. Further, although an axial flow type fan is used as the fan, for example, a centrifugal type fan or the like may be used.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A cooling device comprising:
a first cooling unit; and
a second cooling unit; wherein
the first cooling unit includes:
a first radiator extending in a first direction and including a plurality of plate-shaped fins;
a plate-shaped cold plate extending in a second direction perpendicular to the first direction and provided adjacent to the plurality of plate-shaped fins of the first radiator;
a first pump that circulates refrigerant liquid and that is adjacent to the first radiator in the second direction;
a first tank that stores the refrigerant liquid and that is between the first radiator and the first pump;
a first tank surface provided on a side of the first tank, the first pump connected to the first tank surface in the second direction; and
a first pump surface provided on a side of the first pump;
the second cooling unit is adjacent to the first cooling unit, the second cooling unit includes:
a second radiator extending in the first direction and including a plurality of plate-shaped fins;
a second pump that circulates the refrigerant liquid and is adjacent to the first radiator in the second direction;
a second tank that stores the refrigerant liquid and that is between the second radiator and the second pump;
a second tank surface provided on a side of the second tank, the second pump being connected to the second tank surface in the second direction; and
a second pump surface provided on a side of the second pump;
the first tank surface is opposed to the second tank surface in the second direction and the first pump surface is opposed to the second pump surface in a third direction that is perpendicular to both the first direction and the second direction.

2. The cooling device according to claim 1, wherein a blower fan opposes the first cooling unit and the second cooling unit in the third direction.

3. The cooling device according to claim 1, wherein a gap between the first cooling unit and the second cooling unit adjacent to each other in the second direction is smaller than respective widths of the first cooling unit and the second cooling unit in the second direction.

4. The cooling device according to claim 1, further comprising a plurality of blower fans.

5. A cooling device comprising:
a first cooling unit; and a second cooling unit; wherein
the first cooling unit includes:
- a first radiator extending in a first direction and including a plurality of fins;
- a first pump that circulates refrigerant liquid and that is adjacent to the first radiator in a second direction perpendicular to the first direction;
- a first tank that stores the refrigerant liquid and that is between the first radiator and the first pump;
- a first tank surface provided on a side of the first tank, the first pump being connected to the first tank surface in the second direction; and
- a first pump surface provided on a side of the first pump;

the second cooling unit is adjacent to the first cooling unit, the second cooling unit includes:
- a second radiator extending in the first direction and including a plurality of fins;
- a second pump that circulates the refrigerant liquid and that is adjacent to the first radiator in the second direction;
- a second tank that stores refrigerant liquid and that is between the second radiator and the second pump;
- a second tank surface provided on a side of the second tank, the second pump connected to the second tank surface in the second direction; and
- a second pump surface provided on a side of the second pump; and the first tank surface opposes the second tank surface in the second direction and the first pump surface opposes the second pump surface in a third direction perpendicular to both the first direction and the second direction.

6. The cooling device according to claim 5, further comprising a blower fan opposing the first cooling unit and the second cooling unit in the third direction.

7. The cooling device according to claim 5, wherein a gap between the first cooling unit and the second cooling unit in the second direction is smaller than respective total widths of the first cooling unit and the second cooling unit in the second direction.

8. The cooling device according to claim 5, further comprising a plurality of blower fans.

* * * * *